(12) United States Patent
Cleeves et al.

(10) Patent No.: US 8,891,264 B1
(45) Date of Patent: Nov. 18, 2014

(54) SERIES CIRCUITS AND DEVICES

(75) Inventors: James Montague Cleeves, Redwood City, CA (US); Patrick Smith, San Jose, CA (US)

(73) Assignee: Thin Film Electronics ASA, Oslo (NO)

( * ) Notice: Subject to any disclaimer, the term of this patent is extended or adjusted under 35 U.S.C. 154(b) by 1002 days.

(21) Appl. No.: 11/940,161

(22) Filed: Nov. 14, 2007

Related U.S. Application Data

(60) Provisional application No. 60/859,480, filed on Nov. 15, 2006.

(51) Int. Cl.
*H02H 7/125* (2006.01)
*H02H 7/127* (2006.01)

(52) U.S. Cl.
USPC ............... 363/53; 363/89; 363/125; 257/655; 438/149

(58) Field of Classification Search
USPC ......... 363/44, 52, 53, 71, 76, 77, 84, 89, 125, 363/127; 257/223, 227, 291, 292, 439, 443, 257/655; 438/149, 257
See application file for complete search history.

(56) References Cited

U.S. PATENT DOCUMENTS

| | | | | |
|---|---|---|---|---|
| 4,250,457 A * | 2/1981 | Hofmann | ...................... | 329/349 |
| 4,409,724 A * | 10/1983 | Tasch et al. | ..................... | 438/30 |
| 4,473,757 A * | 9/1984 | Farago et al. | ................. | 307/127 |
| 4,535,203 A * | 8/1985 | Jenkins et al. | ................ | 379/333 |
| 4,538,169 A * | 8/1985 | Smith et al. | ................... | 257/717 |
| 4,819,147 A * | 4/1989 | Bingham | ...................... | 363/127 |
| 4,875,151 A * | 10/1989 | Ellsworth et al. | ............. | 363/127 |
| 5,119,285 A * | 6/1992 | Liu et al. | ........................ | 363/127 |
| 5,479,172 A * | 12/1995 | Smith et al. | ..................... | 342/51 |
| 5,500,537 A * | 3/1996 | Tsumura et al. | ................ | 257/40 |
| 6,078,512 A * | 6/2000 | Bouvier | ........................ | 363/127 |
| 6,349,047 B1 * | 2/2002 | Yu | ................................. | 363/127 |
| 6,509,217 B1 * | 1/2003 | Reddy | .......................... | 438/153 |
| 6,890,629 B2 * | 5/2005 | Casper et al. | ................. | 428/209 |
| 2003/0006825 A1 * | 1/2003 | Lee et al. | ...................... | 327/536 |
| 2004/0207051 A1 * | 10/2004 | Takizawa | ...................... | 257/658 |

\* cited by examiner

*Primary Examiner* — Adolf Berhane
*Assistant Examiner* — Nusrat Quddus
(74) *Attorney, Agent, or Firm* — Andrew D. Fortney; Central California IP Group, P.C.

(57) ABSTRACT

Embodiments of the present invention relate to a rectifier circuit and methods of making the same for use in wireless devices (e.g., RFID tags). The present invention is drawn to a rectifier circuit comprising first and second diode-wired transistors in series, each having a gate oxide layers of the same target thickness. The first diode-wired transistor receives an alternating current and the second diode-wired transistor provides a rectifier output. The first and second diode-wired transistors are configured to divide between them a first voltage differential across the rectifier circuit. The gate oxides are exposed to a peak stress that is similar to a stress on the gate oxide of logic transistors made using the same process. The present invention is further drawn to a method of making a rectifier circuit, comprising printing a plurality of transistor bodies on a substrate, forming a gate oxide on each of the transistor bodies and a gate on each gate oxide, doping exposed portions of the transistor body to form first and second source/drain terminals therein, and forming interconnects electrically connecting the first source/drain terminals to the gate over the corresponding transistor body.

29 Claims, 10 Drawing Sheets

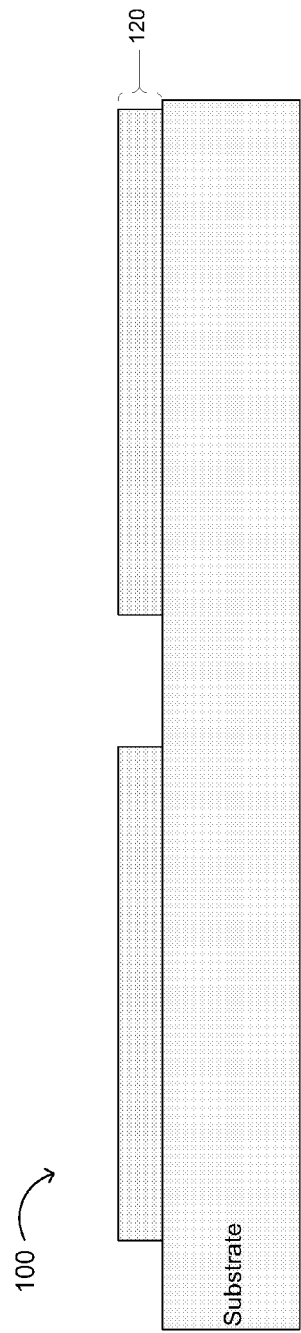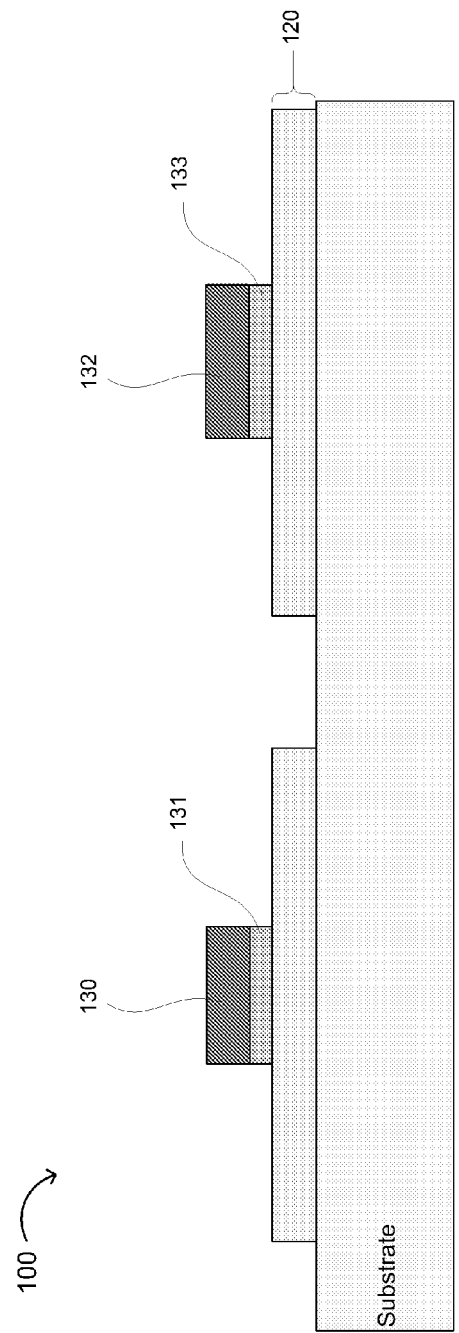

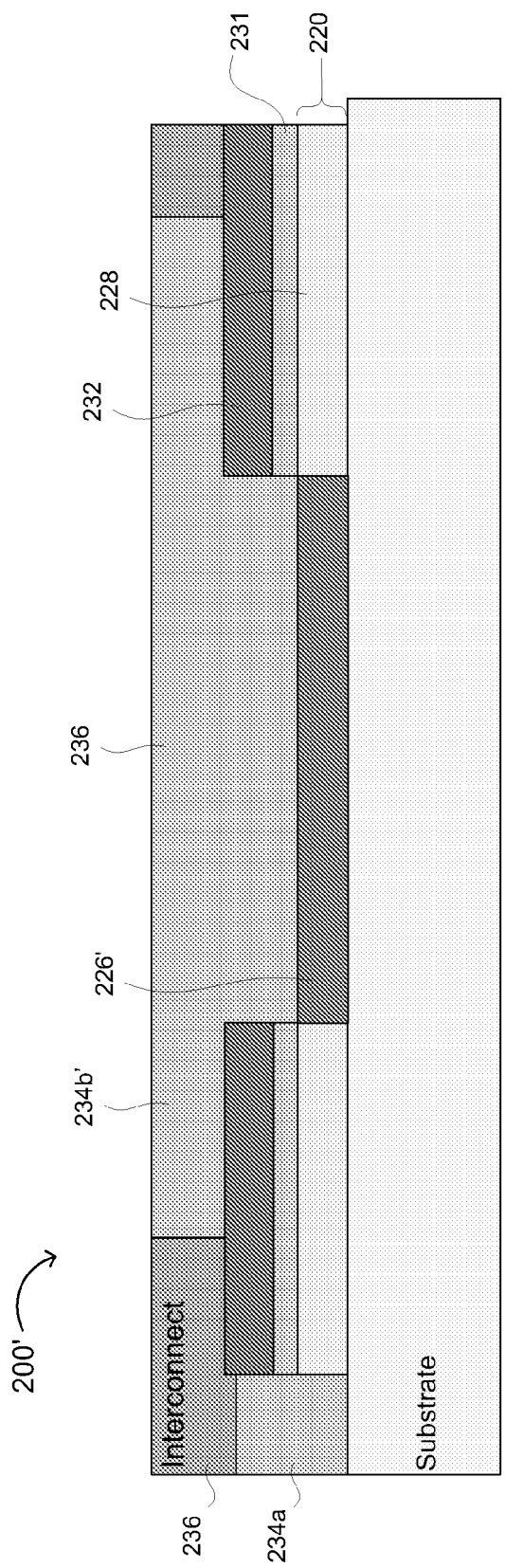

SERIES CIRCUITS AND DEVICES

RELATED APPLICATIONS

This application claims the benefit of U.S. Provisional Patent Application No. 60/859,480, filed Nov. 15, 2006.

FIELD OF THE INVENTION

Embodiments of the present invention relate to a rectifier circuit and methods of making the same for use in wireless devices (e.g., an RFID tag or wireless sensor). The rectifier circuit preferably includes two diode-wired transistors in series configured to divide a voltage equally between the two devices. As a result, a peak stress on gate oxide layers in the transistors is similar to the stress on the transistors elsewhere on the device, and oxide breakdown problems that can occur in single diode-wired transistors in such rectifiers can be avoided or prevented.

DISCUSSION OF THE BACKGROUND

Peak voltage on the incoming wave form to a rectifier in a wireless device (e.g., an RFID tag) is approximately 2× higher than the DC voltage that comes out of the rectifier. The gate oxide of the rectifier transistors is subjected to this high voltage, while the rest of the circuit is not. Thus, rectifier circuits having single diode-wired transistor circuits are subject to potential gate oxide breakdown problems in the single diode-wired circuits.

One approach to avoiding potential oxide breakdown problems is to increase the oxide thickness. However, a thicker oxide generally reduces the performance of transistors in the internal circuits that have the same oxide (or that have an oxide formed in the same processing steps).

This problem can also be addressed by forming oxides of different thicknesses in each type of device (e.g., rectifier transistor vs. logic transistor). However, this adds significant process complexity and cost to the process. A thicker gate oxide in the rectifier transistors also reduces the rectifier efficiency, due to reduced transistor turn on characteristics.

In addition, the dielectric layer of a tuning capacitor(s) (e.g., a tank capacitor in power harvest or conversion circuit) sees a higher voltage than the rectified voltage that the transistors see. To get similar reliability, typically one would use a thicker insulator for the tank capacitor. This generally means extra processing steps, as discussed above.

To reduce the cost of wireless devices such as RFID tags, efforts have been made to explore printing as a low-cost, high-throughput technique for forming certain films for such devices. However, the purity of the materials is in some cases not as high as the materials used in more conventional integrated circuit processing (e.g., films made by chemical and/or physical vapor deposition onto a single-crystal silicon wafer or a material thereon, followed by photolithography and etching), nor do the films formed using printing necessarily have the same electrical properties and characteristics as films made by more conventional integrated circuit processing. As a result, processing steps that adversely affect transistor performance are even more likely to adversely affect performance of a transistor made using a printing technique, and requiring extra processing steps is likely to adversely affect certain advantages of printing over more conventional photolithography and etching (e.g., lower cost and higher throughput).

SUMMARY OF THE INVENTION

Embodiments of the present invention relate to a rectifier circuit and methods of making the same for use in wireless devices (e.g., an RFID tag). The rectifier circuit may comprise a first diode-wired transistor and a second diode-wired transistor in series. The first diode-wired transistor is configured to receive an alternating current and the second diode-wired transistor is configured to provide a rectifier output (e.g., a DC voltage or potential on a filter capacitor at the rectifier output). The construction of the first and second diode-wired transistors allows a voltage differential across the rectifier circuit to be divided between the first and second diode-wired transistors, thereby reducing a peak stress on gate oxide layers of the transistors.

Embodiments of the present invention further relate to a method of making diode-connected thin film transistors (TFTs), printed or patterned structures (e.g., circuitry) containing such diodes and TFTs, and applications of the same for identification tags and sensors. Further applications of the present invention relate to reference voltage generators, voltage clamp circuits, methods of controlling voltages on related or differential signal transmission lines, and HF, UHF and RFID tags and sensors.

The embodiments of the present invention also include processes of making thin film devices (e.g., transistors, capacitors, diodes, etc.) and circuits including the same on various substrates including, but not limited to, glass (e.g., quartz) sheets, wafers or slips, plastic and/or metal foils, sheets or slabs, Si wafers, etc., all of which may carry one or more additional (e.g., buffer, mechanical support, etc.) layers thereon prior to formation of any circuit elements or electrically active films thereon.

One object of the invention is to provide a rectifier circuit having first and second diode-wired transistors in series. The first and second diode-wired transistors may each comprise a printed semiconductor body on a substrate, the semiconductor body having first and second source/drain terminals and a channel therebetween; a gate oxide on the channel and a gate on the gate oxide; and an interconnect electrically connecting the first source/drain terminal to the gate. The interconnect of the second diode-wired transistor electrically connects the first source/drain terminal of the second diode-wired transistor to the gate of the second diode-wired transistor, and further connects to the second source/drain terminal of the first diode-wired transistor. The interconnect of each of the first and second diode-wired transistors is generally a unitary structure, and the transistor bodies of the first and second diode-wired transistors may each be a physically discrete structure.

The first and second diode-wired transistors may be substantially equally sized devices, connected in series and configured to divide a voltage equally between them. The gate oxide layers of each of the first and second diode-wired transistors can have the same target thickness. Consequently, the gate oxide layers of both the first and second diode-wired transistors are generally exposed to a peak stress that is similar to a stress on a gate oxide of logic transistors made using the same process.

The rectifier circuit may further have third and fourth diode-wired transistors in series, wherein the third diode-wired transistor receives a complementary alternating current and the fourth diode-wired transistor has an output connected to the rectifier output (i.e., the DC voltage or potential on a filter capacitor at the rectifier output). The third and fourth diode-wired transistors (which may be structurally similar or identical to the first and second diode-wired transistors) may be configured to divide a second voltage differential across the rectifier circuit between the third and fourth diode-wired transistors. In this embodiment, the first, second, third and fourth diode-wired transistors may have a gate oxide exposed to a peak stress that is similar to the stress on the gate oxide of logic transistors made using the same process.

The rectifier circuit may further have fifth and sixth diode-wired transistors in series, coupled between a node complementary to the rectifier output (e.g., a complementary DC voltage or potential) and the alternating current. The rectifier circuit may also have seventh and eighth diode-wired transistors coupled between the node complementary to the rectifier output (i.e., the complementary DC voltage or potential) and the complementary alternating current. The fifth, sixth, seventh and eighth diode-wired transistors may also be structurally similar or identical to the first and second diode-wired transistors.

Additionally, the rectifier circuit may have first and second capacitors in series, coupled between the alternating current and a complementary alternating current, configured to divide a voltage differential between the alternating current and the complementary alternating current. The first and second capacitors may each comprise a lower electrode on the substrate having an extension portion; a capacitor dielectric layer on the lower electrode; and an upper electrode on the capacitor dielectric layer. A capacitor interconnect may be formed to electrically connect the extension portions of each of the first and second capacitors. The interconnect of each of the first and second diode-wired transistors and the capacitor interconnect (along with the lower electrodes) may each be a unitary structure.

In various embodiments, the lower electrode preferably includes the same material and has the same target thickness as the semiconductor body, and thus, may also be printed. The capacitor dielectric layer preferably includes the same material and has the same target thickness as the gate oxide of the first and second diode-wired transistors. The upper electrode preferably includes the same material and has the same target thickness as the gates of the diode-wired transistors.

Another object of the invention is to provide a method for making a rectifier circuit, comprising the steps of forming a plurality of (discrete) transistor bodies on a substrate by printing a silicon-containing ink on the substrate; forming a gate oxide on each of the transistor bodies; forming a gate on each gate oxide; doping exposed portions of the transistor body to form first and second source/drain terminals therein; and forming interconnects electrically connecting each of the first source/drain terminals to the gate over the corresponding transistor body.

Forming the gate on each gate oxide may comprise laser writing or otherwise printing a metal- and/or silicon-containing ink. The metal- and/or silicon-containing ink of the gate is first printed, and may then be irradiated with laser radiation having a wavelength and an energy sufficient to cure the printed ink prior to forming the first and second source/drain terminals. Alternatively, the ink may be cured by thermal annealing.

Forming the interconnects may comprise printing a metal-containing ink on the first source/drain terminals, the gates, and an insulation layer adapted to electrically isolate the first source/drain terminals and the gates from the interconnect. The printed metal-containing ink is subsequently cured. One of the interconnects further connects the second source/drain terminal of a first transistor body to the first source/drain terminal and the gate of a second transistor body.

The method may further comprise forming first and second capacitors. The method may comprise forming a lower electrode on the substrate by printing a silicon-containing ink on the substrate, the lower electrode having an extension portion; forming a capacitor dielectric layer on the lower electrode; and forming an upper electrode on the capacitor dielectric layer by printing a silicon-containing ink on the substrate. The capacitor dielectric layer is preferably formed in the same step as the gate oxide of the diode-wired transistors, and thus includes the same material (oxide) and the same target thickness. The lower electrode is preferably formed in the same step as the transistor body of the diode-wired transistors, and thus includes the same material and has the same target thickness.

The upper electrode is preferably formed in the same step as the gates of the first and second diode-wired transistors, and thus includes the same material and has the same target thickness. In one embodiment, forming the upper electrode comprises laser writing a metal- and/or silicon-containing ink. The metal- and/or silicon-containing ink of the upper electrode is generally printed, then thermally annealed and/or irradiated with laser radiation having a wavelength and an energy sufficient to cure the printed ink.

A capacitor interconnect to electrically connect the extension portions of each of the first and second capacitors may also be formed. The capacitor interconnect is preferably formed in the same step as the transistor interconnects of the first and second diode-wired transistors, and thus comprises the same material. In one embodiment, forming the capacitor interconnect comprises printing a metal-containing ink on the extension portions of the lower electrodes of the first and second capacitors and an insulation layer adapted to electrically isolate the upper electrodes of the first and second capacitors. The printed metal-containing ink is subsequently cured. Generally, the interconnect of each of the first and second diode-wired transistors and the capacitor interconnect are each a unitary structure.

The present invention provides a rectifier with two diode-wired transistors in series that prevents the potential gate oxide breakdown problems of single diode-wired transistor circuits. In one embodiment, two substantially equally sized devices are connected in series to divide the voltage equally between the two devices. The peak stress on the gate oxide in these transistors is similar to the stress on the rest of the transistors in the tag or device.

The present invention also provides tank capacitors formed in series. The present series-configured capacitors may consume the same area in the tank/rectifier as a single capacitor having a thicker oxide, but the voltage is divided between two capacitors, instead of having the entire voltage drop across just one capacitor. This approach makes the capacitor circuit much less "leaky," and may provide higher manufacturing yields. Additionally, one can advantageously use the same oxide layer for both the tank capacitors and the rectifier transistors (which may also increase the transistor performance by reducing the turn-on voltage). This provides process simplicity while optimizing the performance of both components.

The methods of the present invention enable one skilled in the art to produce an all-printed thin film transistor (TFT) with a high-temperature-compatible gate. This approach leverages the use of a printed silicon ink (or "printed silicon precursor") as both active layer and gate layer. This approach also includes the use of silicon, metal silicides and/or refractory metals and allows the use of self-aligned structures that can withstand the relatively high processing temperatures typically used for dopant out-diffusion and activation. In addition, the use of polysilicon for the TFT structures enables (a) lower work functions for better threshold voltage (Vt) scaling, and (b) reoxidation of the gate edge to enable lower leakage currents, for memory retention (in those logic circuits including memory cells/devices).

The benefits described above and other advantages of the present invention will become readily apparent from the detailed description of the preferred embodiments.

BRIEF DESCRIPTION OF THE DRAWINGS

FIGS. 3A-3D show cross-sectional views of exemplary structures formed in an exemplary process for forming the first and second-wired transistors shown in FIG. 2A.

FIG. 5B shows a cross-sectional view of an exemplary alternative embodiment of the present series-connected capacitors.

DETAILED DESCRIPTION OF THE PREFERRED EMBODIMENTS

Figure 1:
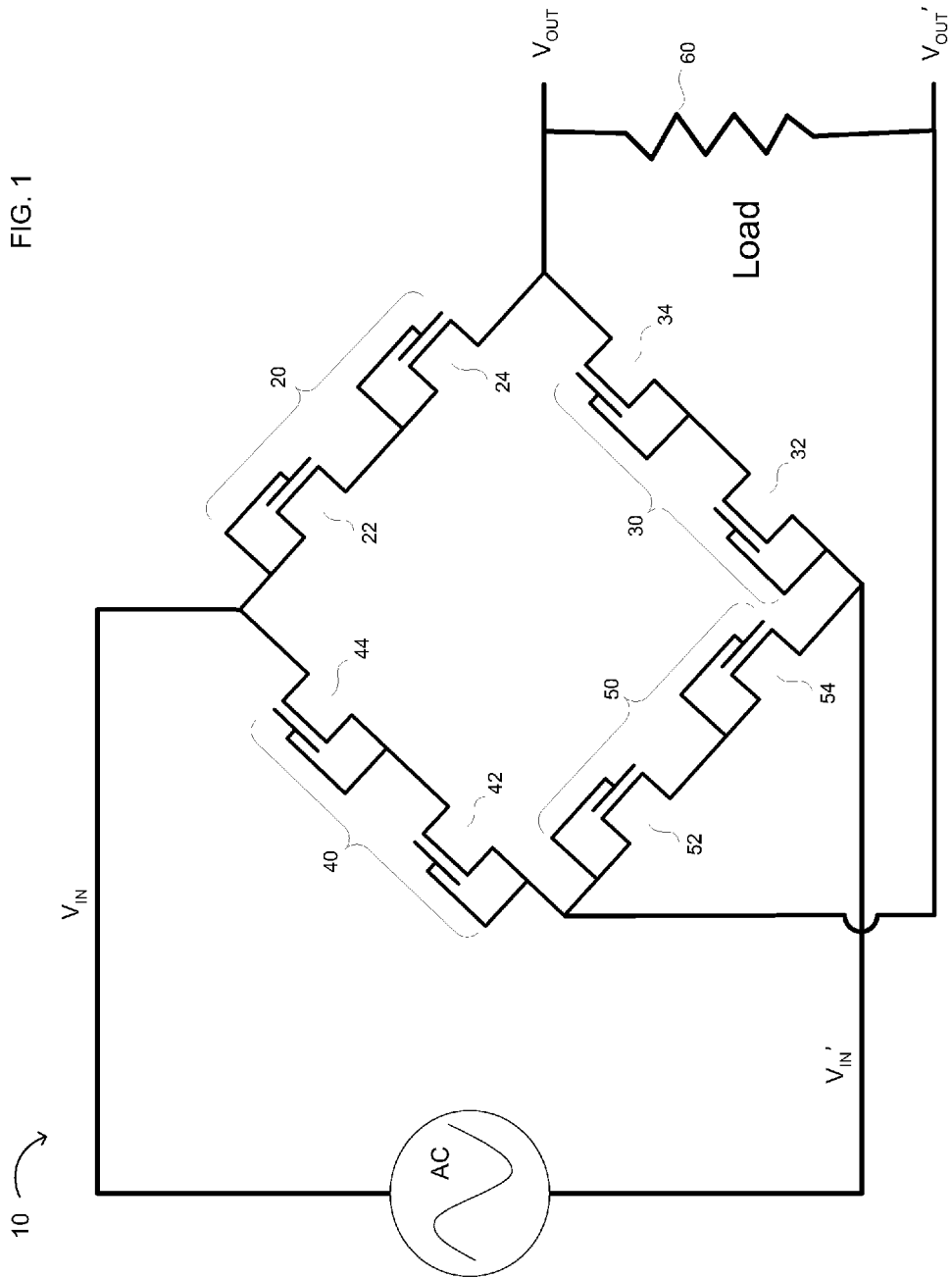
FIG. 1 shows a circuit diagram of an exemplary embodiment of the present rectifier circuit having a plurality of diode-wired, series-connected transistor pairs.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following disclosure numerous specific details are given to provide a thorough understanding of the invention. However, it will be apparent to one skilled in the art that the present invention may be practiced without these specific details. In other instances, well-known methods, procedures, components, and circuits have not been described in detail, to avoid unnecessarily obscuring aspects of the present invention.

Printed thin films can approach thin films that are blanket-deposited from vapor-phase precursors in quality, particularly when the components of the printing ink have sufficient purity. However, the process of forming a thin film from a printed ink can result in certain variations or irregularities in the thin film. For example, printed thin films can have a greater average surface roughness and a slightly lower density than the corresponding thin film form by vapor-phase deposition. For thin films of materials such as silicon (formed from, e.g., a printed silane ink) or metal (formed from, e.g., a printed ink containing metal nanoparticles and/or metal compound[s]), an insulator (e.g., oxide) film grown or deposited thereon may have qualities (such as local variations in thickness or density) that render it less suitable for applications that may expose the insulator film to relatively high voltages. In devices such as capacitors and transistors, such variations and/or irregularities in film quality may result in a relatively low breakdown voltage for the insulator (e.g., capacitor dielectric or transistor gate oxide), as compared to a film of the same material, having an identical target thickness, but formed by vapor-phase deposition and photolithographic patterning.

A rectifier with two diode-wired transistors in series can avoid potential gate oxide breakdown problems that can occur on a corresponding single diode-wired transistor circuit. In one embodiment, two equally sized devices are connected in series to divide the voltage equally between the two devices. In this way, the peak stress on the gate oxide in these transistors is similar to the stress on other transistors in the device. Although the area consumed by the series-connected transistors (when configured to maintain a reasonable series resistance and/or rectifier efficiency) may be more than twice as large as the single-transistor diode, the impact of the relatively large area can be minimized by using relatively inexpensive, high-throughput processing (e.g., printing) and relatively inexpensive substrates (e.g., stainless steel foil, thin plastic sheets, glass slips, etc.). An alternative is three or more diode-wired transistors in series, which may further divide the voltage between the devices and further reduce the peak stress on the gate oxide, but at an increased cost in terms of tag real estate/size. Similarly, two capacitors in series can reduce the voltage applied to the dielectric in each capacitor, relative to a single-capacitor device of the same capacitance.

Exemplary Rectifier Circuits

An exemplary design implementing the bridge circuit of FIG. 1 has been simulated and fabricated, and the results (both simulation and actual) show satisfactory rectifier operation and performance characteristics. As shown in FIG. 1, rectifier circuit 10 may be used in HF, UHF, EAS and RFID tags and sensors. An A/C waveform (e.g., received from an antenna that, in turn, receives a wireless signal or that generates an AC signal in the presence of an electromagnetic field having a particular frequency) is carried on a differential signal path $V_{IN}/V_{IN'}$ to inputs of an exemplary rectifier 10. The AC signal is propagated through the present circuit (exemplified by transistor series or half-wave circuit 20, including first and second diode-wired transistors 22 and 24) for conversion to a power supply $V_{OUT}/V_{OUT'}$ (across a conventional load resistor). As will be understood by those skilled in the art, the inventive concepts described herein for the bridge circuit and/or half-wave circuit 20 are also applicable to full-wave circuits (e.g., further comprising third and fourth diode-wired transistors 32 and 34 in series, the third diode-wired transistor receiving a complementary AC input and the fourth diode-wired transistor having an output connected to the rectifier output). Herein, a bridge circuit may comprise the full-wave circuit, plus fifth and sixth diode-wired transistors 42 and 44 in series, coupled between a node complementary to the rectifier output and the AC input, and seventh and eighth diode-wired transistors 52 and 54 coupled between the node complementary to the rectifier output and the complementary AC input.

The rectifier circuit 10 may thus comprise four series-connected diode pairs (e.g., comprising first diode pair 20, second diode pair 30, third diode pair 40 and fourth diode pair 50). The load resistor 60 across power supply $V_{OUT}/V_{OUT'}$ generally comprises a conventional load resistor. Alternatively or additionally, the rectifier circuit 10 may further comprise series-connected CMOS diode pairs coupled between the AC inputs $V_{IN}/V_{IN'}$ and/or DC outputs $V_{OUT}/V_{OUT'}$ (see, e.g., U.S. patent application Ser. No. 11/521,924, filed Sep. 15, 2006, the relevant portions of which are incorporated herein by reference) as shown in FIG. 2B. Such series-connected CMOS diode pairs utilize the relatively constant difference of the $V_t$ of an NMOS TFT ($V_{tn}$) and the $V_t$ of a PMOS TFT ($V_{tp}$) to establish and/or improve stability of a forward voltage drop across a (printed or laser-written) diode, and thereby provide a voltage clamping circuit (a "clamp"), or a reference voltage generator if connected across DC outputs $V_{OUT}/V_{OUT}'$, as load resistor 60 is connected.

Figure 2A:
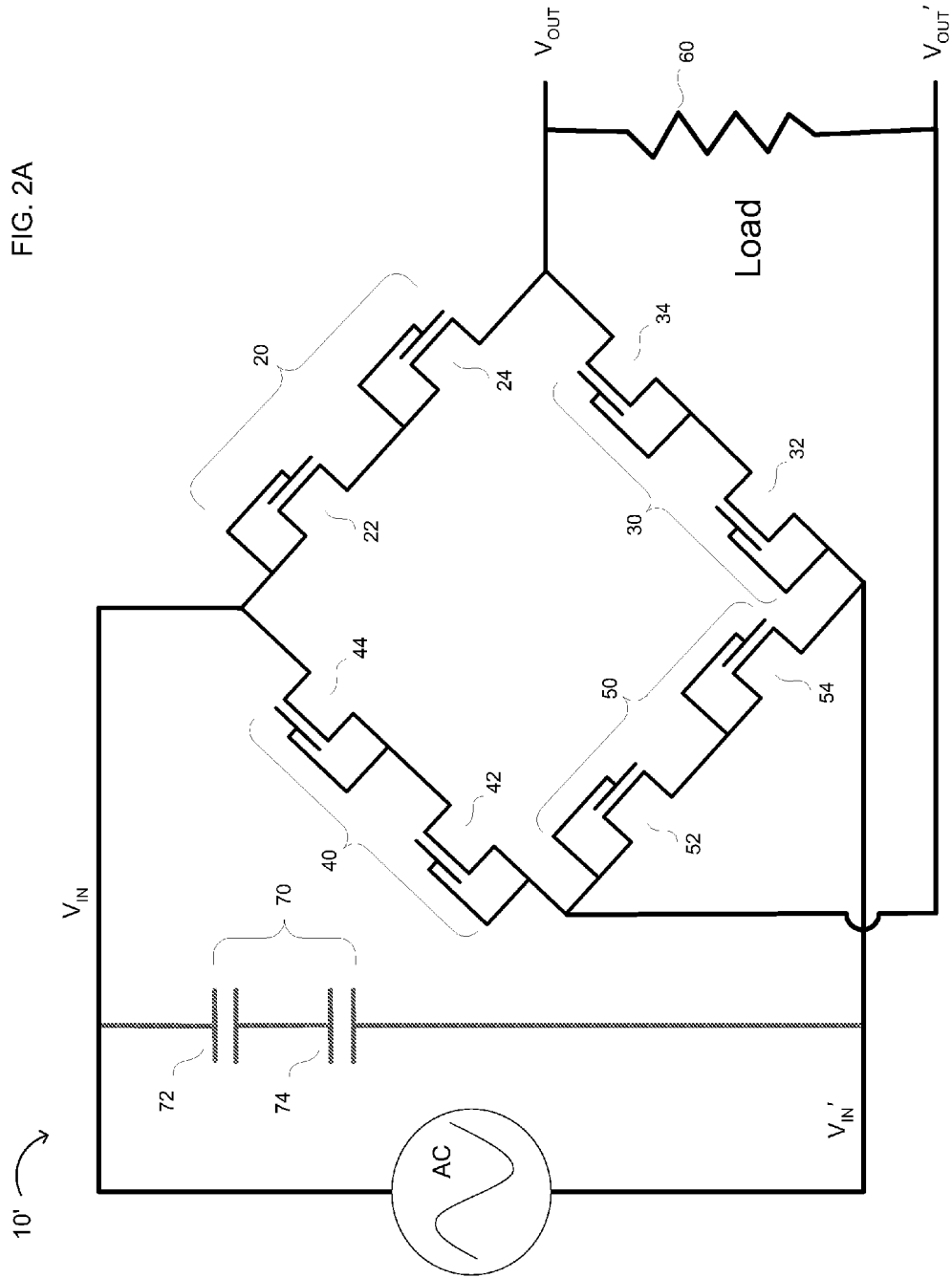
FIG. 2A shows a circuit diagram of an exemplary embodiment of the present rectifier circuit having a plurality of diode-wired, series-connected transistors and first and second capacitors in series in a tank capacitor circuit.
Figure 2B:
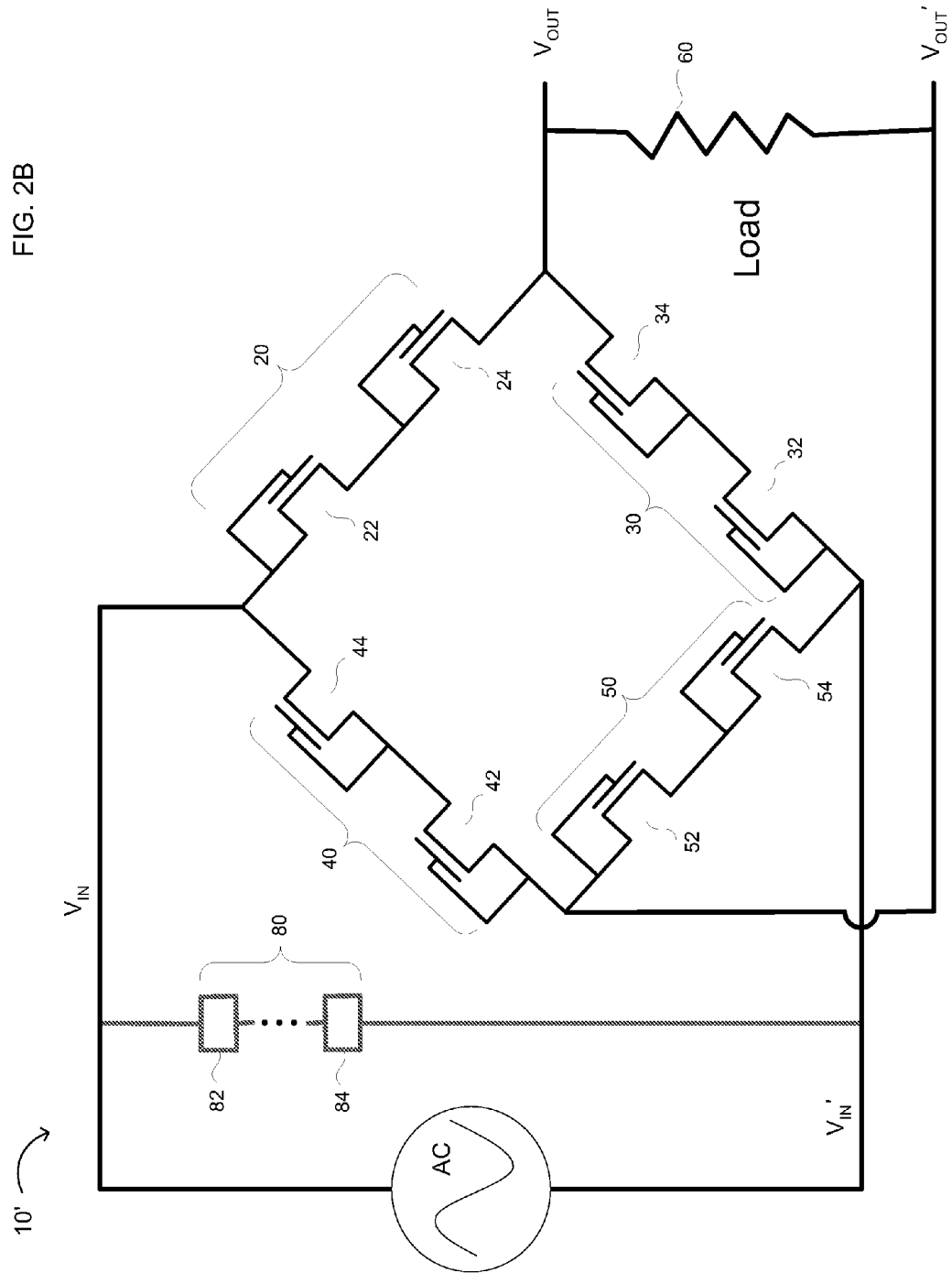
FIG. 2B shows a circuit diagram of an exemplary rectifier circuit that comprises series-connected CMOS diode pairs.

In a further embodiment, as shown in FIG. 2A, a rectifier circuit 10' may include a tank capacitor circuit 70. The capacitor circuit 70 comprises series capacitors 72 and 74, which may receive the external signal (e.g., an 8.2 MHz RF/EAS signal) from an antenna for an EAS and/or RFID tag configured for a deactivation function.

Capacitor series 70 may provide an EAS deactivation function when it has an appropriate breakdown voltage (e.g., in the range of ~10 to 40 V; e.g., from about 10 to about 20 V, from about 20 to about 30 V, from about 30 to about 40 V, or any range of values therein; see, e.g., U.S. Pat. No. 7,152,804). A series capacitor circuit 70 may consume about the same area as a single capacitor having a thicker oxide, but the voltage is divided between two capacitors 72 and 74, instead of having the entire voltage drop across just one capacitor. This makes the capacitor circuit much less "leaky," and is expected to result in higher yields in manufacturing. Additionally, one could advantageously use the same oxide layer for both the tank capacitors 72 and 74 and the rectifier transistors (e.g., 22 and 24), which may also increase the logic transistor performance (when made using the same process) by reducing its turn-on voltage. This embodiment provides process simplicity while optimizing the performance of both components.

Rectifier 10' may be configured to have one or more of dual-mode characteristics and/or provide one or more dual-mode functions (e.g., EAS and RFID functions; see, e.g., U.S. patent application Ser. No. 11/870,775, filed Oct. 11, 2007, the relevant portions of which are incorporated herein by reference). Thus, the present tag or wireless device tag may further comprise an antenna, an electronic article surveillance (EAS) function block coupled to the antenna, and one or more RFID function blocks coupled to the antenna, thus enabling operation of the tag in both EAS and RFID modes. Alternatively, the tag or device may have a high frequency (HF), very high frequency (VHF), or ultra high frequency (UHF) function instead of an RFID function.

Exemplary Methods for Making Series-Connected, Diode-Wired Rectifier Transistors A further aspect of the invention relates to a method of making the present rectifier circuit 10. The method generally comprises forming a plurality of transistor bodies on a substrate (generally by printing), forming a gate oxide on each of the transistor bodies and a gate on each gate oxide, doping exposed portions of the transistor body to form first and second source/drain terminals therein, and forming interconnects electrically connecting each of the first source/drain terminals to the gate over the corresponding transistor body.

Advantageously, part or all of the present rectifier circuit may be manufactured using printing technology, rather than photolithography. Such a manufacturing approach minimizes waste of materials, increases throughput, and allows for greater customization of certain functional layers that can be formed substantially simultaneously, relative to photolithographic processes. Suitable printing processes for forming patterned layers of (doped) silicon, metal, and insulator can be found in U.S. Pat. No. 7,152,804 and U.S. patent application Ser. Nos. 10/616,147, 10/949,013, 10/950,373, 10/956,714, 11/243,460, 11/104,375, 11/452,108, 11/888,942, 11/888,949 and 11/842,884, filed Jul. 8, 2003, Sep. 24, 2004, Sep. 24, 2004, Oct. 1, 2004, Oct. 3, 2005, Apr. 11, 2005, Jun. 12, 2006, Aug. 3, 2007, Aug. 3, 2007, and Aug. 21, 2007, respectively, the relevant portions of each of which is incorporated by reference herein.

However, the method is not limited to techniques for printing electronic devices (e.g., devices with one or more printed layers or structures). The method can also be implemented equally well using fabrication techniques commonly associated with circuits on single crystal substrates (e.g., CMOS circuits on silicon wafers). In one embodiment, for example, load resistors (e.g., 60 in FIGS. 1-2B) may be formed or placed in the single crystal circuit to provide it with one or more characteristics similar to or the same as the printed circuit.

One technique that can be used in either case involves configuring the transistor series of the rectifier 10 (see, e.g., diode-wired transistors 22-24 in FIG. 1) to have a high threshold voltage and the rest of the circuit to have a lower threshold voltage. In such a case, the rectifier turns on only under high power (e.g., in the presence of a relatively high applied electric field, such as that found in close proximity to a reader). In addition, the operating power to run the rest of the logic stays low due to the lower threshold voltages of the transistors (and other devices) in such logic. In the case of printed devices, the threshold of the devices may be varied by adding dopant(s) to the ink(s) such that ink(s) with different doping (or dopant) levels therein are printed (e.g., by inkjetting or offset lithography) in the different areas. Higher doping typically increases the threshold, and lower doping decreases the threshold.

An exemplary embodiment of the present method of making a rectifier circuit, involving printed transistors, is shown in FIGS. 3A-3D and described below.

FIG. 3A shows a substrate with first and second transistor bodies 120 thereon. The substrate generally comprises a conventional mechanical support structure, which may be electrically inert or active, and which may further include one or more advantageous and/or desired electrical and/or optical properties. Suitable electrically inert or inactive substrates may comprise a plate, disc, and/or sheet of a glass, ceramic, dielectric and/or plastic. Preferably, the substrate comprises a member selected from the group consisting of a silicon wafer, a glass plate, a ceramic plate or disc, a plastic sheet or disc, metal foil, a metal sheet or disc, and laminated or layered combinations thereof. For example, the substrate generally has a barrier layer, buffer layer and/or insulator layer (e.g., when the substrate comprises a metal foil or sheet, a layer of the corresponding oxide) thereon. In certain embodiments, the insulator layer may comprise a spin-on glass barrier layer having a thickness of about 1 μm. Similarly, glass and plastic substrates may further contain a planarization layer thereon to reduce the surface roughness of the substrate, and/or a surface energy modifying layer thereon of a material that improves the adhesion and/or that controls the spreading of a subsequent material (e.g., an ink) printed or otherwise deposited thereon (see U.S. Provisional Application No. 60/919,290, filed on Mar. 20, 2007).

Still referring to FIG. 3A, first and second transistor bodies 120 are formed on the substrate. In one embodiment, the first and second transistor bodies 120 are formed by printing a molecular and/or nanoparticle-based semiconductor ink, then converting it to an amorphous, hydrogenated semiconductor film, generally by heating and/or curing (see, e.g., U.S. Pat. No. 6,878,184 and/or U.S. patent application Ser. Nos. 10/616,147, 10/789,274, 10/950,373, 10/949,013, 10/956,714, 11/246,014, 11/249,167 and 11/867,587, filed on Jul. 8, 2003, Feb. 27, 2004, Sep. 24, 2004, Sep. 24, 2004, Oct. 1, 2004, Oct. 6, 2005, Oct. 11, 2005, and Oct. 4, 2007, respectively). The amorphous, hydrogenated semiconductor film is then annealed (either by heating or irradiating with a laser) to form a polycrystalline semiconductor and/or to activate any dopant therein. Typically, the molecular and/or nanoparticle-based semiconductor ink comprises a (poly)silane, (poly)germane, and/or (poly)silagermane that is liquid at ambient temperatures (e.g., room temperature, or about 15-30° C.). The (poly)silane, -germane and/or silagermane ink may further comprise an organophosphine, -borane, -arsine or -stibene (i.e., antimony, or Sb) dopant. Alternatively, the transistor bodies 120 may comprise a conventional metal chalcogenide or organic semiconductor.

Instead of printing, one may conventionally deposit a semiconductor film (e.g., by PECVD, LPCVD, sputtering of an elemental target, etc.), and pattern the film by photolithography. Further, the deposited (e.g., printed, coated or conventionally deposited) semiconductor film (e.g., in the case where the semiconductor film comprises or consists essentially of a Group IVA element) may be crystallized in part or substantially completely by (UV) laser exposure, furnace or RTA anneal, optionally in the presence of a crystallization promoter such as Au, Ni, Al, etc. When the semiconductor film is crystallized by laser annealing, one may simply remove the non-irradiated, amorphous portions of the deposited film by selective etching in accordance with known techniques.

Referring to FIG. 3B, gates 130 and 132 are formed over first and second transistor structures 120. Forming the gates 130 and 132 may include forming a gate oxide layer and a gate layer. The gate oxide layer may be formed by known techniques (e.g., plasma-enhanced chemical vapor deposition [CVD], low-, atmospheric- or high-pressure CVD; thermal oxidation in wet or dry oxidizing atmospheres, chemical bath deposition of silicon oxide[s] [e.g., silicon dioxide], liquid phase deposition [e.g., printing or coating] of a dielectric [e.g., a $SiO_2$], etc.). Forming the gate layer of gates 130 and 132 may include printing a semiconductor precursor ink onto the gate oxide layer to form a pattern, drying the ink, curing the ink (generally by heating and or annealing the dried ink for a length of time sufficient to cross-link, oligomerize and/or polymerize a silane or Group IVA element precursor, and/or increase an average molecular weight, increase a viscosity and/or reduce a volatility of the composition), then partially or substantially completely crystallizing the semiconductor film pattern to form a polycrystalline (e.g., polysilicon) film. The gate oxide film, if formed to completely cover the semiconductor bodies 120, may be selectively etched (by wet or dry etching) to form gate oxides 131 and 133.

Techniques for local printing of a liquid semiconductor precursor ink directly onto a substrate (or surface film thereof) to form a semiconductor layer such as the gate layers are described in copending U.S. patent application Ser. Nos. 10/949,013 and 11/203,563, filed on Sep. 24, 2004 and Aug. 11, 2005, as well as other applications described herein. This latter approach to forming TFT structures may be cost effective due to (i) the efficient usage of the semiconductor precursor materials and (ii) the combination of semiconductor deposition and patterning into one printing step.

The semiconductor inks suitable for use in the present invention comprise a liquid-phase (poly)- and/or (cyclo)silane. Suitable liquid-phase semiconductor inks may further comprise a semiconductor nanoparticle (such as passivated Si, Ge or SiGe nanoparticles) and/or a solvent, preferably a cycloalkane. Such nanoparticles (or nanocrystals) may be conventionally passivated (e.g., with one or more surfactants and/or surface ligands, such as alkyl, aralkyl, alcohol, alkoxy, mercaptan, alkylthio, carboxylic acid and/or carboxylate groups). Thus, when using an ink comprising or consisting essentially of a Group IVA element source (such as a silane-and/or nanoparticle-based precursor to Si or doped Si), forming the semiconductor layer 30 may further comprise drying the liquid-phase precursor ink after deposition. See, e.g., copending U.S. application Ser. Nos. 10/616,147, 10/789,317, 10/789,274, 11/246,014 and 11/249,167, respectively, filed Jul. 8, 2003, Feb. 27, 2004, Feb. 27, 2004, Oct. 6, 2005 and Oct. 11, 2005, respectively, the relevant portions of which are incorporated herein by reference.

The gate layer(s) may be formed using [doped] polysilicon and/or a metal (or a metal silicide), as described above and in the above-reference patent applications. In one embodiment, the gate layers may be lightly doped (e.g., having a dopant concentration of from about $10^{16}$ to about $10^{18}$ atoms/cm$^3$). Exemplary lightly doped semiconductor films and methods of forming the same are disclosed in copending U.S. application Ser. Nos. 10/950,373, 10/949,013, 10/956,714, 11/246,014 and 11/249,167, respectively filed on Sep. 24, 2004, Sep. 24, 2004, Oct. 1, 2004, Oct. 6, 2005 and Oct. 11, 2005. When formed from an ink containing one or more (doped) molecular- and/or nanoparticle-based silicon precursors, the lightly doped gate layers may have a concentration profile (e.g., dopant concentration as a function of semiconductor layer thickness) in an amorphous state that is substantially uniform throughout substantially the entire thickness of the semiconductor layer.

As a further alternative, the gate layers of the gates 130 and 132 can be formed by conventional blanket deposition and (low-resolution) lithographic patterning. Blanket deposition may comprise, e.g., evaporation, physical vapor deposition, sputtering, or chemical vapor deposition, as is known in the art. Alternatively, blanket deposition may comprise spin-coating an ink comprising, e.g., metal nanoparticles, a (poly)-and/or (cyclo)silane, and/or semiconductor nanoparticles (which may be passivated) and a solvent, and curing the ink (see, e.g., U.S. Pat. No. 6,878,184 and U.S. patent application Ser. No. 10/749,876, filed Dec. 31, 2003). When using a metal nanoparticle-based ink (which can be either printed or spin-coated onto the substrate), a seed layer can be formed by drying, curing and annealing the metal in the ink, then a bulk metal conductor (e.g., Cu, Ni, Pd, Al, etc.) can be electroplated or electrolessly plated onto the seed layer.

The gates 130 and 132 may have any thickness achievable using any technology described herein, but typical thicknesses for the gates 130 and 132 may be from about 10, 25, 50, or 100 nm to about 200, 500 or 1000 nm, or any range of values therein. Similarly, the gate oxide 131/133 may have any thickness achievable using any technology described herein, but typical thicknesses may be from about 2, 5 or 10 nm to about 20, 50, 100, 200 or 400 nm, or any range of values therein. The film thicknesses may be chosen to optimize the electrical properties of the transistor. Alternatively, when the gate layers comprise multiple layers, they can have the same or different doping types and/or concentrations, and they can form various types of diodes (e.g., p-n or p-i-n diodes, Schottky diodes, etc.), although the gate oxide may not be present and the interconnect may have a different structure in such devices.

Figure 3C:
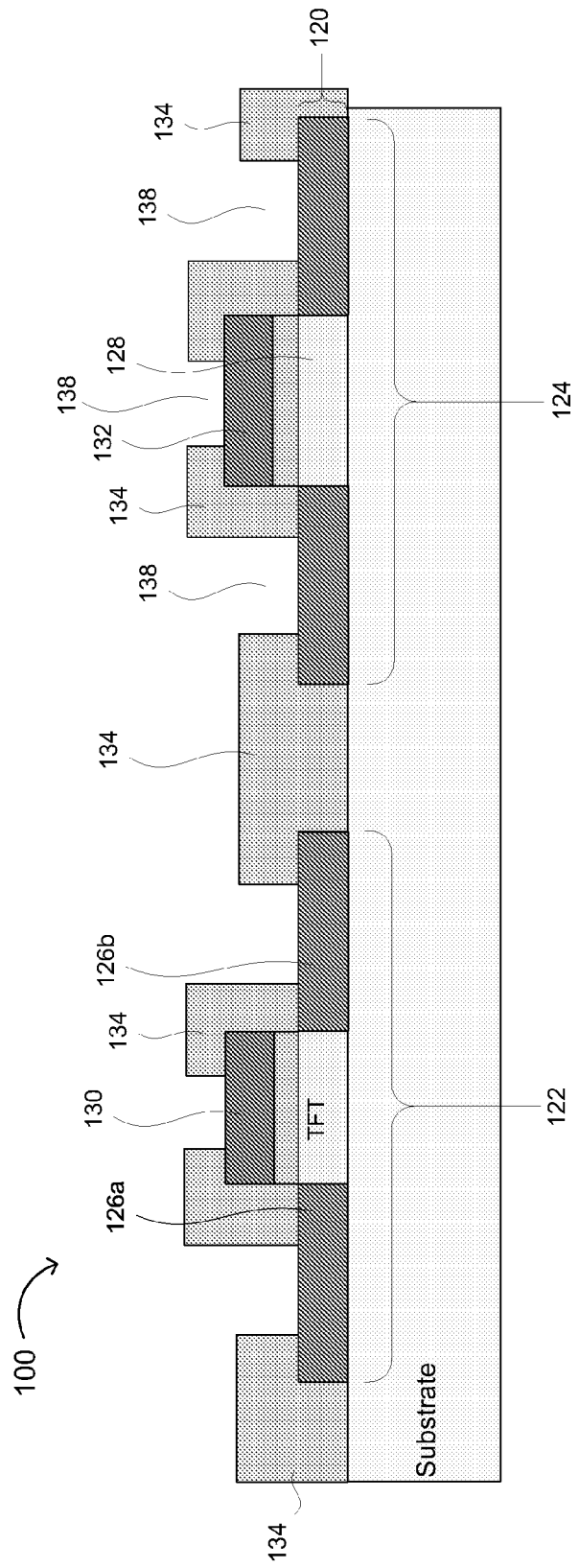

Referring to FIG. 3C, an insulating layer 134 is formed over the substrate, including portions of gates 130 and 132 and portions of transistor bodies 120, with openings 138 exposing at least part of an upper surface of the gates 130 and 132 and of the source/drain terminals 126*a* and 126*b* adjacent to on opposed sides of the gates 130 and 132. The insulating layer 134 may be blanket-deposited (e.g., by spin-coating, CVD, atomic layer deposition, combinations thereof, etc.) or printed over the entirety of the gates 130 and 132, transistor bodies 120, and space between the transistor bodies 120. Openings 138 may then be formed photolithographic masking and wet or dry etching. Alternatively, the insulating layer 134 may be printed in a pattern that includes openings 138 in such locations, in which case the insulating layer 134 may be further etched (typically by wet etching) sufficiently to widen the openings 138. Forming openings 138 may comprise removing portions of the insulating layer 134 (e.g., as described in U.S. patent application Ser. No. 11/818,078, filed on Jun. 12, 2007), particularly when a printed insulating layer pattern does not include openings.

Printing may comprise inkjet printing, microspotting, stenciling, stamping, syringe dispensing, pump dispensing, screen printing, gravure printing, offset printing, or flexography. In one embodiment, the (doped) insulator layer 134 is printed by inkjetting. The printed insulating layer 134 may also be doped. Dopant may be subsequently diffused into the underlying transistor bodies 120 by annealing to form source/drain terminals 126a and 126b adjacent to and aligned with the gates 130 and 132.

A part of the insulator layer 134 remains in the space between transistors 122 and 124 to electrically isolate subsequently formed interconnects 136 that connect adjacent source/drain terminals of adjacent transistors. This embodiment may further include forming the insulating layer 134 such that it has a sufficient thickness variation in the contact areas from the remainder of the layer to enable a timed etch (e.g., either an etchback or an anisotropic etch) to form openings 138 over the gates 130 and 132 and the source/drain areas 126a and 126b, while only partially removing the dielectric area in the remaining areas. Typically, the thinnest parts of the insulating layer 134 will be over the corners of the gates 130 and 132 and the source/drain areas 126a and 126b.

Still referring to FIG. 3C, when insulating layer 134 contains a dopant, dopant drive in and activation are conducted (generally by annealing). Typically, annealing is conducted at a temperature in the range of 750-1100° C. (but preferably, in one implementation, at a temperature of ≤800° C.) using furnace annealing or Rapid Thermal Annealing (RTA). In such an implementation, the gate material is selected to be able to tolerate this temperature (e.g., Cu, Ni, Pd, Si or silicides of such metals, etc.). In a preferred embodiment, source/drain terminals 126a and 126b can be automatically doped during drive in/activation of dopant from the insulating layer 134 into the transistor bodies 120, thereby forming transistors 122 and 124. Alternatively, the dopant may be driven into the transistor bodies 120 (e.g., silicon) by UV-lamp flash annealing or laser irradiation, using a wavelength of light and/or a light power sufficient to diffuse a dopant from the insulating layer 134 into the transistor bodies 120 and/or activate the dopant once in the transistor bodies 120.

Preferably, insulating layer 134 comprises a printable dielectric precursor material or spin-on glass formulation (see, e.g., U.S. patent application Ser. Nos. 11/888,942 and 11/888,949, each filed Aug. 3, 2007, the relevant portions of which are incorporated herein by reference), and the dopant may be selected from the group consisting of B, P, As and Sb. Alternatively, the doped insulator layer 134 can be formed by printing a doped silane ink (as disclosed in U.S. patent application Ser. Nos. 10/949,013, 10/950,373, 10/956,714 and 11/249,167), which, after printing, may be cured in an oxidizing atmosphere, or a doped glass ink which is directly inkjetted onto the substrate, islands and gate (as disclosed above and/or in U.S. Provisional Appl. No. 60/926,125, filed Apr. 24, 2007, the relevant portions of which are incorporated herein by reference). Alternatively, the doped dielectric ink may comprise a partially oxidized silane (e.g., cyclo-$Si_5O_5H_{10}$, or cyclo-$[SiH(OH)]_5$).

Alternatively, prior to forming insulating layer 134, a source/drain contact layer (not shown) may be formed on the upper surface of transistor bodies 120 by depositing a doped semiconductor composition onto the gates 130 and 132 and exposed areas of transistor bodies 120, then laser irradiating the doped semiconductor composition to selectively crystallize irradiated portions of the composition (and preferably activate dopant therein), and selectively removing non-irradiated portions of the composition by wet etching (see, e.g., U.S. patent application Ser. No. 11/084,448, filed on Mar. 18, 2005, the relevant portions of each of which are incorporated herein by reference). Such doped semiconductor compositions may be selectively deposited by printing or inkjetting a doped silicon-containing formulation, such as an $N^+$-doped silane ink (see U.S. patent application Ser. Nos. 10/950,373, 10/949,013, 10/956,714 and 11/249,167, filed on Sep. 24, 2004, Sep. 24, 2004, Oct. 1, 2004, and Oct. 11, 2005, respectively, the relevant portions of each of which are incorporated herein by reference) onto the gates 130 and 132 and exposed portions of the transistor bodies 120.

To the extent heavily doped source/drain terminals 126a and 126b comprise an amorphous Group IVA element-containing material (e.g., Si and/or Ge), one preferably crystallizes them before depositing the next layer. In one example, the source/drain terminals 126a and 126b are first cured by furnace annealing, and then crystallized by laser crystallization (and preferably, some or substantially all of the dopant therein activated during the crystallization). Alternatively, dopant atoms may be introduced into or onto the exposed surfaces of transistor bodies 120 by plasma deposition, laser decomposition, vapor deposition or other technique, after which the doped regions are converted into source and drain contacts by annealing.

Alternatively, using other techniques described in the above-referenced patent applications, source/drain terminals 126a and 126b may be doped to form transistors 122 and 124 prior to forming the insulating layer 134. Specifically, source/drain terminals 126a and 126b may be heavily doped (e.g., with n-type or p-type ions) by conventional ion implantation and annealing to drive the dopant into the semiconductor layer (i.e., the regions of transistor bodies 120 not covered by gates 130 and 132).

Figure 3D:
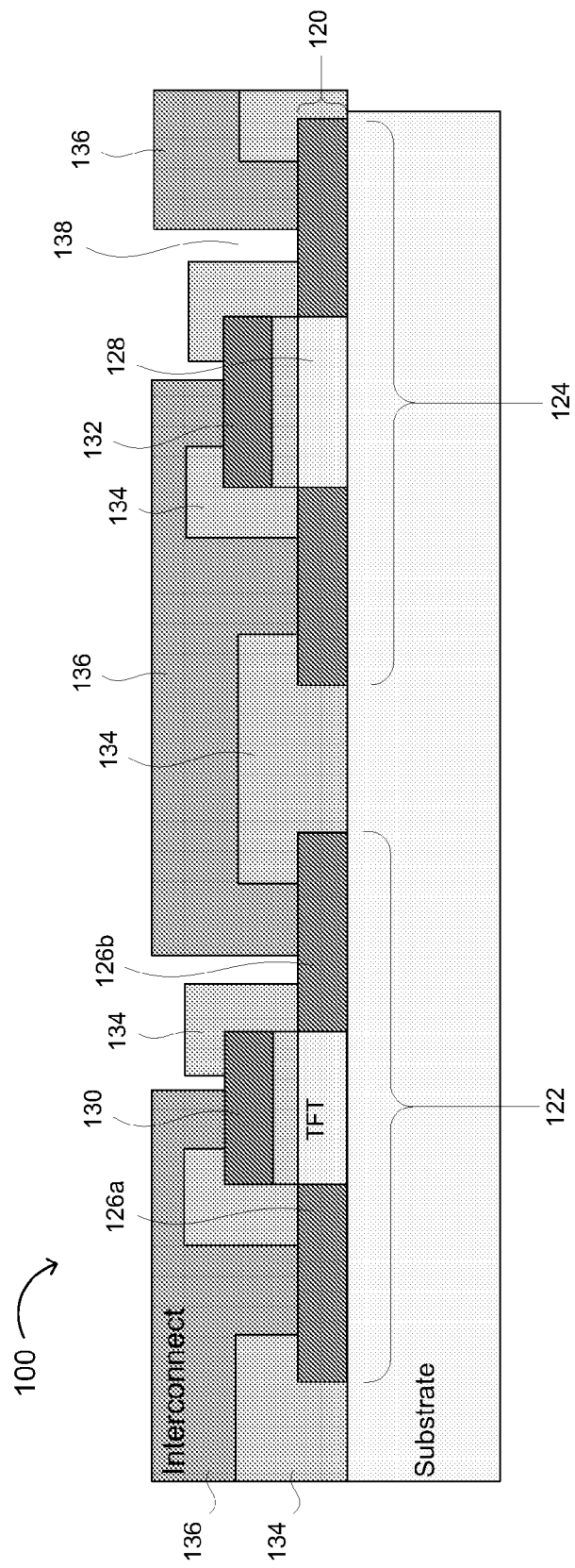

Referring to FIG. 3D, an interconnect layer 136 is printed or otherwise formed on transistors 122 and 124 such that one source/drain terminal (e.g., 126a) of each transistor is electrically connected to the corresponding gate (e.g., 130 and 132, respectively), and the other source/drain terminal (e.g., 126b) of first transistor 122 is electrically connected to the first source/drain terminal (e.g., 126a) of the second transistor 124 and to gate 132, thereby forming the series diode-wired transistor circuit 20 of FIG. 1. The printed interconnect metal 136 is used to connect transistors within the same layer and/or to provide a lower resistance (or shallower) contact area within the openings 138. The same techniques and materials described above for the gates 130 and 132 can be utilized for printing an interconnect layer 136 (see also U.S. Pat. Nos. 7,152,804 and 7,286,053 and U.S. patent application Ser. No. 11/243,460, filed on Oct. 3, 2005, the relevant portions of each of which are incorporated herein by reference), although the interconnect layer 136 is generally a metal or other similarly highly conductive material.

Thus, printing and/or forming the interconnect layer 136 may include printing a suitable interconnect metal precursor (e.g., an ink containing metal nanoparticles and/or organometallic compound(s), silicide precursor(s), etc.) and converting the dried precursor(s) to the interconnect metal. Alternatively, a precursor for a seed layer may be printed on the contact and/or interconnect areas, and the interconnect metal (e.g., Ag, Au, Cu, Pd, Pt, etc.) can be subsequently electro- or electrolessly plated on the seed layer, as described elsewhere herein.

In another alternative, patterning the interconnect metal may include coating or printing the interconnect metal precursor and locally exposing it to laser radiation such that its solubility characteristics are changed in the exposed areas. Upon washing away the undesired area, the desired area of interconnect metal precursor stays behind to form the interconnect metal, generally after an additional curing or annealing step. This embodiment may provide advantages for the patterning of relatively high-resolution metal interconnects, which may not directly be achievable with direct printing methods.

To ensure good contact, the structure may furthermore be annealed to form a silicide at an interface with silicon, or throughout the entire film thickness of the contact areas between the interconnect metal and the silicon. Suitable silicide forming metals include but are not limited to Al, Ni, Pd, Pt, Mo, W, Ti, Co, etc. The interconnect metal may thus be chosen from such silicide forming metals. Alternatively, the interconnect metal precursor ink may contain additives which form silicides. For example, silver inks doped with Ni organometallic compounds have been observed to lower the contact resistance between a silver interconnect and doped silicon source/drain contacts. An analysis has also revealed that the Ni in such an ink has segregated to the silicon interface, presumably resulting in formation of a silicide.

Before or after printing the interconnect layer 136, the doped dielectric 134 may be removed, and an interlayer dielectric (not indicated) may be printed or otherwise deposited to cover any exposed active areas (e.g., the gates 130 and 132 and source/drain regions 126a-b), but either leaving via holes (e.g., similar or identical to openings 138 in FIG. 3C) in the appropriate areas or etching the interlayer dielectric to form such via holes. The interlayer dielectric precursor may comprise a glass-forming formulation (e.g., spin-on-glass formulations such as [organo]-silicates or -siloxanes), an organic dielectric (e.g., polyimides, BCB, etc.), an oxidized silicon precursor (e.g., an oxidized silane such as $Si_5O_5H_{10}$, etc.), or a molecular and/or nanoparticle-based silicon formulation (which can be oxidized after printing).

The transistors formed by the exemplary processes discussed above are formed as part of a series of diode-wired transistors (e.g., diodes 22-24 of the rectifier 10 in FIG. 1). The transistors 22-24 may have a relatively high threshold voltage, while the transistors in the rest of the tag, wireless device or other circuit may have a lower threshold voltage. In such a case, the threshold voltage can be controlled by the dopant level in the (poly)silane ink. In the case of printed devices, ink(s) with different doping levels and/or dopant(s) therein are printed (e.g., by inkjetting or offset lithography) in different areas. Higher doping typically increases the threshold, and lower doping decreases the threshold. When the (poly)silane ink is printed (e.g., by inkjetting), an ink containing a relatively high level, concentration or dose of dopant can be contained in a first ink reservoir, and an ink containing a relatively low level, concentration or dose of dopant can be contained in a second ink reservoir, but both inks can be printed at the same time (generally in different patterns or specific locations). In fact, inks containing one or more n-dopants and one or more p-dopants can also be contained in separate reservoirs, but printed in different patterns or locations. In such an embodiment, the rectifier 10 turns on only under high power (e.g., in the presence of a relatively high applied electric field, such as that found in close proximity to a reader). In addition, the operating power to run the logic circuits in the tag or wireless device may stay low due to the lower threshold voltages of the transistors (and other devices) in such logic.

Figure 4:
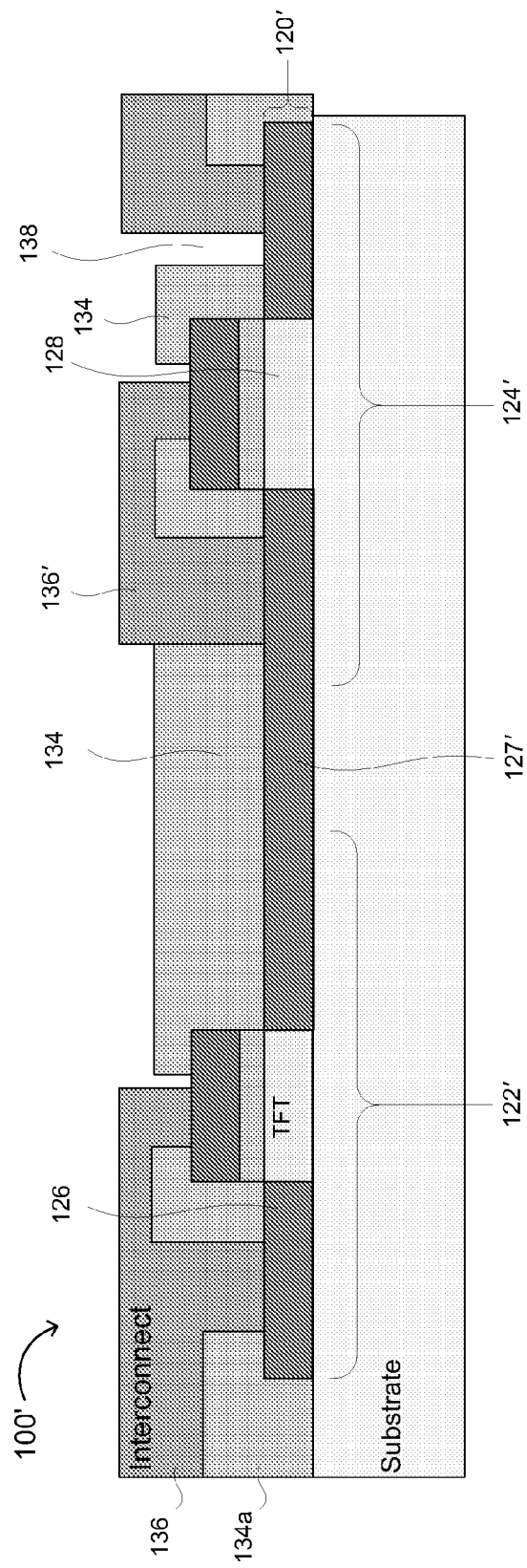
FIG. 4 shows a cross-sectional view of an alternative embodiment of the exemplary first and second diode-wired, series-connected transistors.

FIG. 4 shows a cross-section of an alternative embodiment of the series-connected, diode-wired transistor circuit 20 of FIG. 1. Transistors 122' and 124' comprise a common transistor (TFT) body 120', including common source-drain region 127. Common transistor body 120' can be formed by the processes described above for forming transistor bodies 120 as shown in FIGS. 3A-3D. Also, common source-drain region 127 can be formed by the processes described above for forming source/drain terminals 126a and 126b as shown in FIGS. 3C-3D. A relatively small interconnect 136' electrically connects the gate of transistor 124 to the common source-drain region 127. The common source-drain region 127 eliminates two sources of ohmic contact resistance between transistors 122 and 124.

Exemplary Series Tank Capacitors

If capacitors are formed in series, about the same area is consumed in the tank and/or rectifier as a single capacitor having a thicker oxide, but the voltage is divided between the series capacitors, instead of having the entire voltage drop across just one capacitor. Such series capacitors generally have less current or charge leakage, and are expected to result in higher yields in manufacturing. Additionally, one can advantageously use the same oxide layer for both the series tank capacitors and the rectifier transistors. This provides process simplicity while optimizing the performance of both components.

Figure 5A:
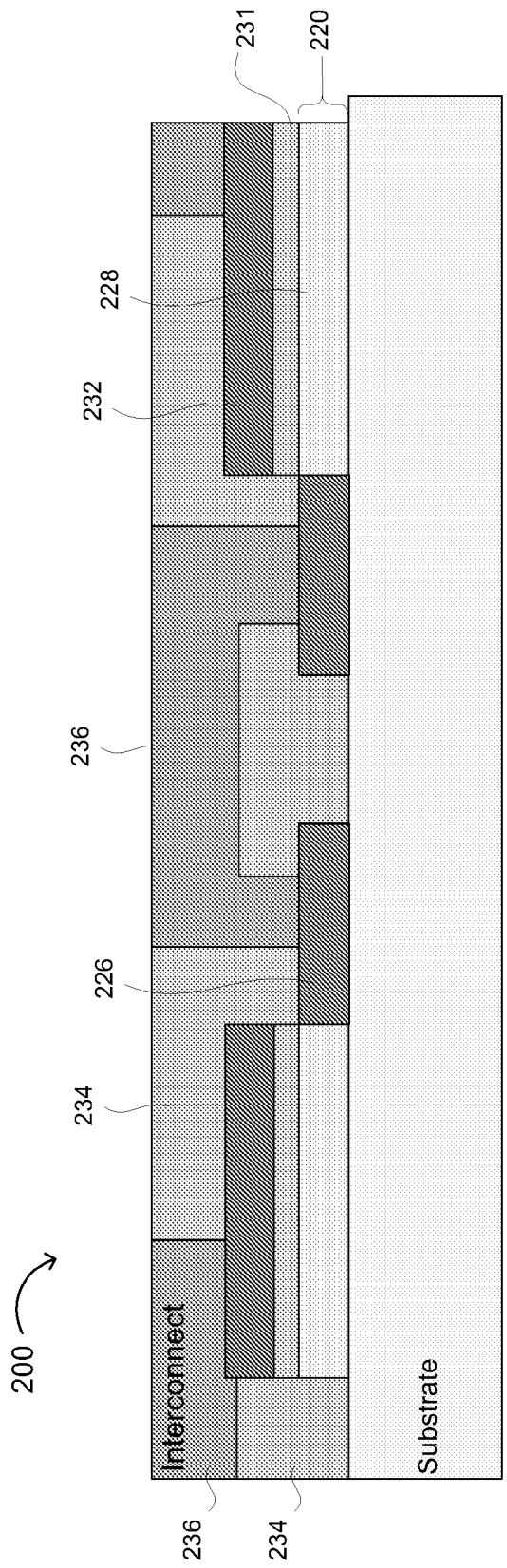
FIG. 5A shows a cross-sectional view of an exemplary embodiment of the present series-connected capacitors.
Figure 6A:
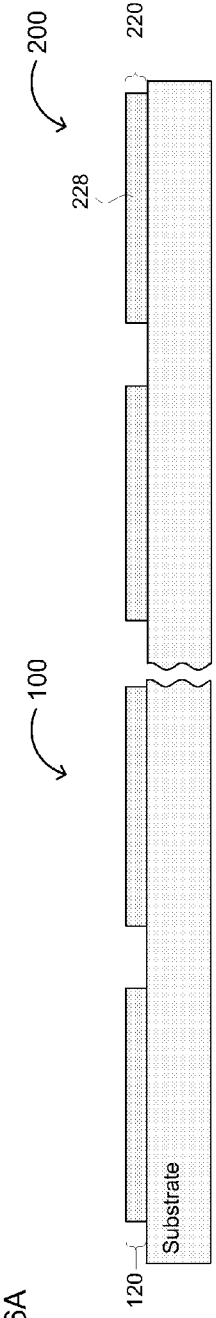
FIGS. 6A-6D show a cross-sectional view of an exemplary process for simultaneously forming the diode-wired transistors of FIGS. 3A-3D and the first and second capacitors of FIG. 5A.
Figure 6B:
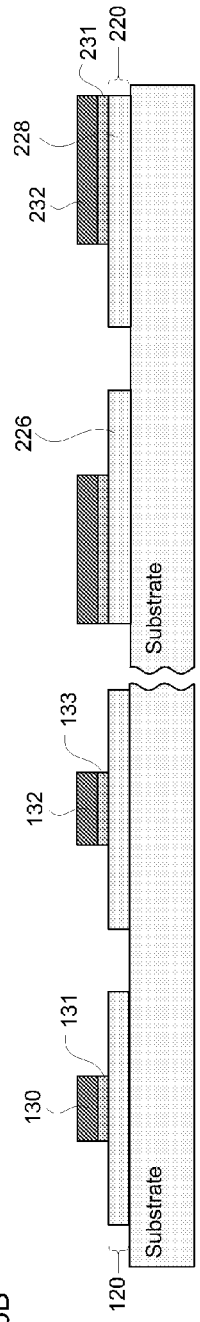
Figure 6C:
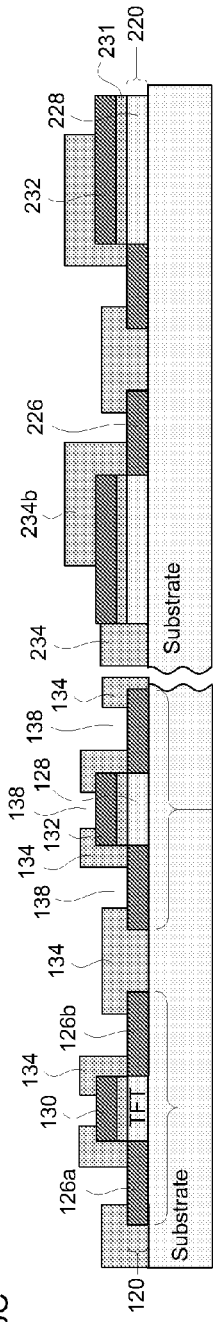
Figure 6D:
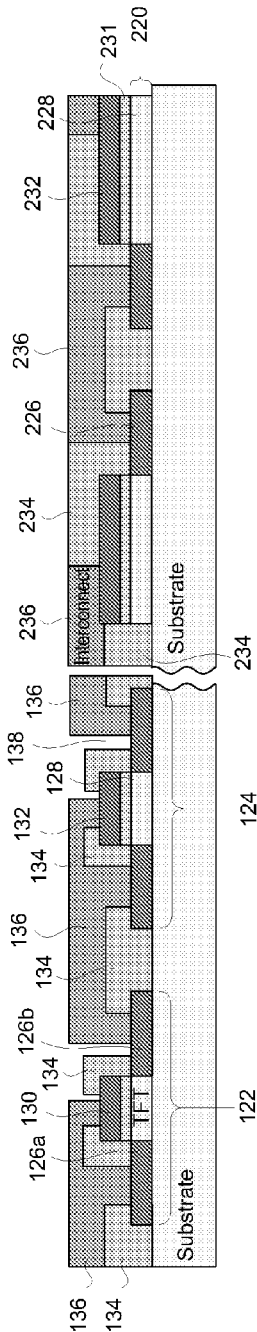

FIG. 2A shows the combination 10' of the rectifier of FIG. 1 and an exemplary tank capacitor circuit 70, comprising first and second capacitors 72 and 74, in series across the differential AC input $V_{IN}/V_{IN'}$ (e.g., between an alternating current and a complementary alternating current). FIG. 5A shows a cross-section of an exemplary capacitor circuit 200, comprising first and second capacitors, each including a lower electrode 228 on the substrate having an extension portion 226, a capacitor dielectric layer 231 on the lower electrode, and an upper electrode 232 on the capacitor dielectric layer 231. A capacitor interconnect 236 electrically connects the extension portions 226 of each of the first and second capacitors.

Lower electrodes 220 may be advantageously formed at the same time as the first and second transistor (TFT) bodies 120 of FIGS. 2A-B, and lower electrode extension areas 226 (FIG. 4) may be doped at the same time as the source/drain terminals 126a-b of transistors 122 and 124 (FIG. 2). Upper electrodes 232 and the dielectric 231 in FIG. 5A may be formed at the same time as gate oxide 131 and 133 of FIG. 3B. Insulator layer 234 and interconnect 236 (FIG. 5A) may be formed at the same time as insulator layer 134 and interconnect layer 136 of FIGS. 3C-3D, respectively.

FIG. 5B shows a cross-section of an alternative embodiment of the tank capacitor circuit 70 of FIG. 2A. The capacitor circuit 70 includes a lower electrode extension 226', which simplifies processing (e.g., by making use of relatively low-resolution printing or photolithography to form lower electrode layer 220). The interconnect between first and second capacitors 142 and 144 is eliminated, thereby eliminating two sources of ohmic contact resistance between the capacitors, and enabling use of relatively low-resolution printing or photolithography methods to form insulator layer 234 (and/or the openings therein) and/or interconnect 236.

FIGS. 6A-6D show, side-by-side, intermediate structures formed during an exemplary process for simultaneously making rectifier transistors 122 and 124 and tank/rectifier capacitor circuit 200, as described above.

CONCLUSION/SUMMARY

Embodiments of the present invention relate to a rectifier circuit and methods of making the same for use in wireless devices (e.g., an RFID tag, "dual function" EAS/RFID tags, wireless sensors, smart tags such as wireless toll booth ID/payment stickers and security cards, etc.). The present invention concerns a rectifier circuit comprising first and second diode-wired transistors in series, each having a gate oxide layer that preferably has the same target thickness. The first diode-wired transistor receives an alternating current and the second diode-wired transistor provides a rectifier output. The first and second diode-wired transistors are configured to divide between them a first voltage differential across the rectifier circuit. The gate oxides are exposed to a peak stress that is similar to a stress on a gate oxide of logic transistors made using the same process. The present invention is further drawn to a method of making a rectifier circuit, comprising printing a plurality of transistor bodies on a substrate, forming a gate oxide on each of the transistor bodies and a gate on each gate oxide, doping exposed portions of the transistor bodies to form first and second source/drain terminals therein, and forming interconnects electrically connecting each of the first source/drain terminals to the gate over the corresponding transistor body. Further applications of the present invention relate to reference voltage generators, voltage clamp circuits, methods of controlling voltages on related or differential signal transmission lines, and HF, UHF and RFID tags and sensors.

Embodiments of the present invention further relate to a method of simultaneously making diode-connected thin film transistors (TFTs, which may be PMOS, NMOS and/or CMOS, as the case may be), printed or patterned structures (e.g., circuitry) containing such diodes and TFTs, and series-connected capacitors useful in such EAS, HF, UHF and/or RFID tags and sensors. The embodiments of the present invention also include processes of making thin film devices (e.g., transistors, capacitors, diodes, etc.) and circuits including the same on various substrates including, but not limited to, glass (e.g., quartz, silica, borosilicates, etc.) sheets, wafers or slips, plastic and/or metal foils, sheets or slabs, silicon or ceramic wafers, etc., all of which may carry one or more additional (e.g., buffer, mechanical support, etc.) layers thereon prior to formation of any circuit elements or electrically active films thereon.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A rectifier circuit, comprising:
   a substrate comprising a member selected from the group consisting of a silicon wafer, a glass plate, a ceramic plate or disc, a plastic sheet or disc, metal foil, a metal sheet or disc, and laminated or layered combinations thereof;
   first and second diode-wired thin film metal-oxide-semiconductor transistors (TFTs) in series, each diode-wired TFT having a channel in a patterned semiconductor body on the substrate, and each diode-wired TFT comprising a gate oxide layer on the patterned semiconductor body, and a gate on the gate oxide layer, the gate oxide layer of each diode-wired TFT having a same target thickness,
   the first diode-wired TFT receiving an alternating current and providing a first output, and the second diode-wired TFT receiving said first output and providing a rectified output, the first and second diode-wired TFTs configured to divide a first voltage differential across the rectifier circuit; and
   third and fourth diode-wired TFTs in series, each of the third and fourth diode-wired TFTs having a channel in a corresponding patterned semiconductor body on the substrate, a gate oxide on the corresponding patterned semiconductor body structurally similar to the gate oxide of the first and second diode-wired TFTs, the third diode-wired TFT receiving a complementary alternating current and providing a second output, the fourth diode-wired TFT receiving said second output and having an output connected to the rectified output, the third and fourth diode-wired TFTs configured to divide a second voltage differential across the rectifier circuit.

2. The rectifier circuit of claim 1, further comprising fifth and sixth diode-wired TFTs in series, each of the fifth and sixth diode-wired TFTs having a corresponding patterned semiconductor body on the substrate, a gate oxide on the corresponding patterned semiconductor body structurally similar to the gate oxide of the first and second diode-wired TFTs, and a gate on the gate oxide layer, coupled between a node complementary to the rectified output and the alternating current, and seventh and eight diode-wired TFTs in series, each of the seventh and eight diode-wired TFTs having a corresponding patterned semiconductor body on the substrate, a gate oxide on the corresponding patterned semiconductor body structurally similar to the gate oxide of the first and second diode-wired TFTs, and a gate on the gate oxide layer, coupled between the node complementary to the rectified output and the complementary alternating current.

3. The rectifier circuit of claim 1, further comprising a plurality of logic TFTs, the logic TFTs comprising a patterned semiconductor body on the substrate, a gate oxide on the patterned semiconductor body, and a gate on the gate oxide layer, wherein the gate oxide of each of the first, second, third and fourth diode-wired TFTs is exposed to a peak stress that is similar to a stress on the gate oxide of the logic TFTs.

4. The rectifier circuit of claim 1, wherein each of the first and second diode-wired TFTs further comprises:
   a) first and second source/drain terminals in or on the patterned semiconductor body, the channel being between the first and second source/drain terminals; and
   b) an interconnect electrically connecting the first source/drain terminal to the gate.

5. The rectifier circuit of claim 4, wherein the interconnect of the second diode-wired TFT is further connected to the second source/drain terminal of the first diode-wired TFT.

6. The rectifier circuit of claim 1, further comprising first and second capacitors in series, coupled between the alternating current and a complementary alternating current, configured to divide a voltage differential between the alternating current and the complementary alternating current.

7. The rectifier circuit of claim 6, wherein the first and second capacitors each include a dielectric layer having a target thickness equal to the target thickness of the gate oxide of the first and second diode-wired TFTs.

8. The rectifier circuit of claim 6, wherein each of the first and second capacitors comprises:
   a) a lower electrode on the substrate, the lower electrode having an extension portion;
   b) a dielectric layer on the lower electrode; and
   c) an upper electrode on the dielectric layer.

9. The rectifier circuit of claim 8, further comprising a capacitor interconnect electrically connecting the extension portions of each of the first and second capacitors.

10. The rectifier circuit of claim 8, wherein the lower electrode includes a same material and has a same target thickness as the patterned semiconductor body.

11. The rectifier circuit of claim 8, wherein the dielectric layer includes a same material and has the same target thickness as the gate oxide.

12. The rectifier circuit of claim 8, wherein the upper electrode includes a same material and has a same target thickness as a gate of the first and second diode-wired TFTs.

13. A method of making a rectifier circuit, comprising:
   a) forming one or more patterned semiconductor bodies on a substrate;
   b) forming a gate oxide on the one or more patterned semiconductor bodies for each of a plurality of thin film transistors (TFTs), each gate oxide having a same target thickness, and a gate on each gate oxide, thereby forming the plurality of TFTs;
   c) doping exposed portions of the one or more semiconductor bodies to form first and second source/drain terminals for each of the plurality of TFTs;
   d) forming interconnects electrically connecting each of the first source/drain terminals to a corresponding gate, thereby forming a plurality of diode-wired TFTs in series, wherein the second source/drain terminal of a first one of the plurality of diode-wired TFTs is electrically connected to the first source/drain terminal of a second one of the plurality of diode-wired TFTs and the second source/drain terminal of a third one of the plurality of diode-wired TFTs is electrically connected to the first source/drain terminal of a fourth one of the plurality of diode-wired TFTs; and
   e) configuring (i) the first and third diode-wired TFTs to receive an alternating current and (ii) the second and fourth diode-wired TFTs to provide a rectified output, wherein each of (i) the first and second diode-wired TFTs and (ii) the third and fourth diode-wired TFTs are configured to divide a voltage differential across the rectifier circuit.

14. The method of claim 13, wherein forming the interconnects comprises printing a metal-containing ink on the first source/drain terminals, the gates, and an insulation layer adapted to electrically isolate the first source/drain terminals and the gates.

15. The method of claim 13, further comprising forming first and second capacitors.

16. The method of claim 15, wherein each of the first and second capacitors comprises:
   a) a lower electrode on the substrate, the lower electrode having an extension portion;
   b) a capacitor dielectric layer on the lower electrode; and
   c) an upper electrode on the dielectric layer.

17. The method of claim 16, wherein the capacitor dielectric layer has a same target thickness as that of the gate oxide.

18. The method of claim 16, wherein the lower electrode includes a same material and has a same target thickness as the semiconductor body.

19. The method of claim 16, wherein the upper electrode includes a same material and has a same target thickness at the gate.

20. The method of claim 16, further comprising forming a capacitor interconnect electrically connecting the extension portions of each of the first and second capacitors.

21. An RFID tag, comprising the rectifier circuit of claim 1 and a plurality of logic TFTs.

22. The RFID tag of claim 21, wherein the gate oxides of the first and second diode-wired TFTs are exposed to a peak stress that is similar to a stress on a gate oxide of the logic TFTs.

23. The method of 13, wherein forming said one or more patterned semiconductor bodies comprises printing a plurality of said patterned semiconductor bodies.

24. The method of claim 13, wherein forming said one or more patterned semiconductor bodies comprises depositing a semiconductor thin film on the substrate and photolithographically patterning said semiconductor thin film.

25. The method of 16, comprising forming said lower electrode substantially simultaneously with said one or more patterned semiconductor bodies, forming said capacitor dielectric layer substantially simultaneously with said gate oxide, and forming said upper electrode substantially simultaneously with said gate.

26. The method of 13, wherein forming said interconnects comprises coating an interconnect metal precursor and locally exposing said interconnect metal precursor to laser radiation.

27. The rectifier circuit of claim 1, wherein the patterned semiconductor body comprises a printed semiconductor body.

28. The method of claim 13, wherein the second source/drain terminal of the first diode-wired TFT and the first source/drain terminal of the second diode-wired TFT are a common source/drain region of a single patterned semiconductor body.

29. The rectifier circuit of claim 1, wherein the first and second voltage differentials are the same.

* * * * *